United States Patent [19]
Mori

[11] Patent Number: 5,166,541
[45] Date of Patent: Nov. 24, 1992

[54] SWITCHING APPARATUS WITH TRANSIENT VOLTAGE CANCELLATION

[75] Inventor: Haruyoshi Mori, Kobe, Japan

[73] Assignee: Mitsubishi Denki Kabushiki Kaisha, Tokyo, Japan

[21] Appl. No.: 735,253

[22] Filed: Jul. 24, 1991

[30] Foreign Application Priority Data

Jul. 25, 1990 [JP] Japan .................. 2-200708

[51] Int. Cl.⁵ .............. H03K 17/00; H03K 17/06; H03K 17/16; H03K 17/51
[52] U.S. Cl. .................... 307/248; 307/254; 307/572; 307/577; 307/630; 307/633; 363/65
[58] Field of Search .......... 307/248, 491, 572, 630, 307/633, 640, 254, 577; 363/56, 65; 361/58, 111

[56] References Cited

U.S. PATENT DOCUMENTS

| | | | |
|---|---|---|---|
| 3,297,911 | 1/1967 | Quinn | 307/633 |
| 3,325,598 | 6/1967 | O'Neill, Jr. | 307/254 |
| 3,715,608 | 2/1973 | Glorioso | 307/254 |
| 3,743,859 | 7/1973 | Exner | 307/640 |
| 3,778,639 | 12/1973 | Higuchi et al. | 307/254 |
| 3,855,518 | 12/1974 | Genuit | 307/633 |
| 3,921,034 | 11/1975 | Nakamura | 361/58 |
| 4,675,543 | 6/1987 | Mitsuoka | 307/633 |
| 4,775,925 | 10/1988 | Lezan et al. | 307/633 |
| 4,823,023 | 4/1989 | Shimpo et al. | 307/254 |
| 4,831,288 | 5/1989 | Chida et al. | 307/254 |

*Primary Examiner*—Janice A. Howell
*Assistant Examiner*—Terry D. Cunningham
*Attorney, Agent, or Firm*—Leydig, Voit & Mayer

[57] ABSTRACT

A switching apparatus including a plurality of semiconductor switching elements each of which has a pair of main circuit electrodes and a control electrode. Each load-side electrode of the pair of main circuit electrodes of each semiconductor switching element is connected in common and the control electrodes are controlled by a common control power supply so as to control the conductance between the main circuit electrodes. A transformer having a first coil and a second coil of the same polarity as the first coil is connected to each of the semiconductor switching elements. The first coil is inserted between the control signal source and the load-side main circuit electrode, and the second coil is inserted between the control signal source and the control electrode.

10 Claims, 3 Drawing Sheets

SWITCHING APPARATUS WITH TRANSIENT VOLTAGE CANCELLATION

BACKGROUND OF THE INVENTION

1. Field of the Invention

The present invention relates to a switching apparatus including a plurality of semiconductor switching elements, for example, transistors.

2. Description of the Related Art

FIG. 7 is a circuit diagram showing a conventional switching apparatus. In the figure, reference numeral 1a and 1b each denote an insulated gate bipolar transistor, which is a semiconductor switching element, (hereinafter referred to as an IGBT). Each IGBT has a pair of main circuit electrodes, that is a collector C and an emitter E. Each IGBT is further provided with a terminal (e) at of the emitter E which is at a reference potential, and has a control electrode (g) which is insulated from the collector C and the emitter E. Reference numeral 2 denotes a bus line of a power supply; reference numeral 3 denotes a bus line connected to a load; reference numeral 4 denotes a first connection conductor from bus line 3 to IGBT 1a; reference numeral 5 denotes the inductance of the connection conductor 4; reference numeral 6 denotes a first connection conductor from bus line 3 to IGBT 1b; and reference numeral 7 denotes the inductance of the connection conductor 6. Of two IGBTs 1a and 1b, their collectors C are connected to the power-supply bus line 2 respectively via second connection conductors 4a and 6a; their emitters E are connected to the bus line 3 through the first connection conductors 4 and 6, respectively.

Reference numeral 10 denotes a control signal source which is connected to the two IGBTs 1a and 1b. The control signal source 10 has two voltage sources incorporated therein: a first signal source 11 and a second signal source 12 connected as shown in FIG. 7. The negative side of the first signal source 11 and the positive side of the second signal source 12 are connected to a terminal 13. The positive side of the second signal source 11 and the negative side of the second signal source 12 are connected to a terminal 14 via an unillustrated switching circuit.

Reference numerals 15 and 18 each denote a first connection line, and reference numerals 17 and 20 each denote a second connection line. The connection lines each connect the terminals 13 and 14 of the control signal source 10 with the terminals (e) and control electrodes (g) of the IGBTs 1 on the right and left sides, as shown in FIG. 7. Reference numeral 16 schematically denotes the inductance of the connection line 15; reference numeral 19 schematically denotes the inductance of the connection line 18.

Next, the operation of the conventional switching apparatus will be explained. The voltage of the first signal source 11 is applied by closing an unillustrated switching circuit, so that the terminals (e) become negative and the control electrodes (g) become positive. As a result, the sections between the collectors C and the emitters E conduct in response to the applied voltage, thereby allowing a load current to flow from the power-supply bus line 2 to the load-side bus line 3. If a predetermined voltage of the second signal source 12 is applied so that the terminals (e) become positive and the control electrodes (g) become negative, the conductance between the collector C and the emitter E is blocked, thereby shutting off current flowing from the power-supply bus line 2 to the load bus line 3.

Semiconductor switching elements generally have variations in the time (turn-on/turn-off time) from the application of a switching signal to their control electrodes until the section between main circuit electrodes is open or closed. Also, connection conductors and connection lines for connecting semiconductor switching elements or the like have inductance.

It will now be assumed that the IGBTs 1a and 1b are opened by a voltage signal from the control signal source 10, whereby a current flowing from the collector C of each of IGBTs 1a and 1b to the emitter E thereof is shut off. If the turn-off time of the IGBT 1a should be shorter than the turn-off time of the IGBT 1b, the current flowing through the IGBT 1a decreases earlier. Therefore, a voltage proportional to the product of the ratio of change in current which depends on the characteristics of the IGBT 1a and the inductance 5 of the connection conductor 4 on the left side develops across both ends of the inductance 5, with the voltage having the polarities shown in FIG. 7, i.e., the bus line 3 becomes positive and the emitter E of the IGBT 1a becomes negative. This developed voltage is divided into a plurality of voltages having polarities indicated by symbols ⊕ and ⊖ in FIG. 7 in proportion to the respective inductances on a series circuit formed by inductance 7, inductance 19 and inductance 16. As a result, a voltage smaller than or greater than the voltage applied from the control signal source 10 is applied to the control electrode (g) of the IGBTs 1a or 1b.

Since the conventional switching apparatus is constructed as described above, a voltage induced by inductances 5 and 7 at the time of control, e.g., at opening/closing time, is applied to inductances 16 and 19 between the control signal source 10 and the terminals (e) of the IGBTs, with the result that a voltage higher than or lower than the voltage supplied from the control signal source 10 is applied to the control electrode (g) of the IGBT. Hence, in some cases the IGBTs malfunction or in some cases IGBTs are destroyed because a voltage above an allowable voltage for IGBTs was applied thereto.

SUMMARY OF THE INVENTION

The present invention has been devised to solve the above-mentioned problems. It is accordingly an object of the present invention to produce a highly reliable switching apparatus including and stably controlling a plurality of semiconductor switching elements, one of the main circuit electrodes being connected in common, by means of a common control signal source.

The switching apparatus of the present invention includes a transformer having a first coil and a second coil which has the same polarity as that of the first coil. The first coil is inserted between the control signal source and one of the main circuit electrodes of a semiconductor switching element. The second coil is inserted between the control signal source and the control electrode of the semiconductor switching element.

In the transformer of the present invention, a first coil has a voltage generated on one of the main circuit electrodes of a semiconductor switching element when the semiconductor switching element is controlled. A voltage having the same polarity as that of the above voltage is generated, by a second coil, between the control signal source and the control electrode of IGBT. Thus, the voltage generated on the one side of the main circuit electrodes is cancelled or offset, thereby causing no abnormal voltage to be applied to the control electrode.

DESCRIPTION OF THE PREFERRED EMBODIMENTS

Figure 1:
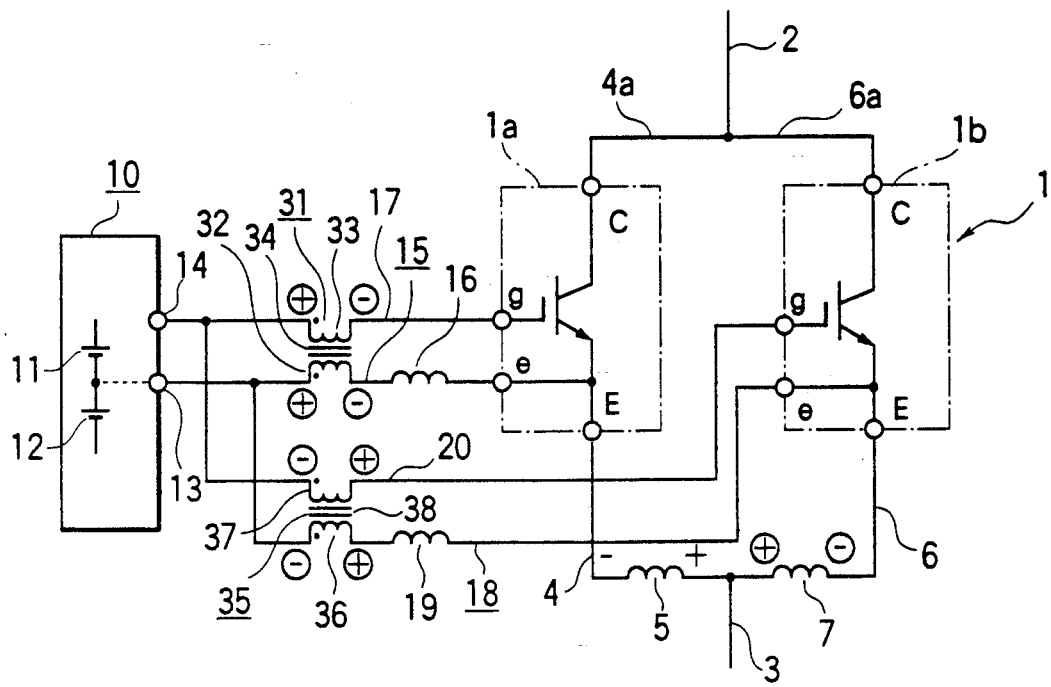
FIG. 1 is a circuit diagram showing an embodiment of a switching apparatus according to the present invention.
Figure 7:
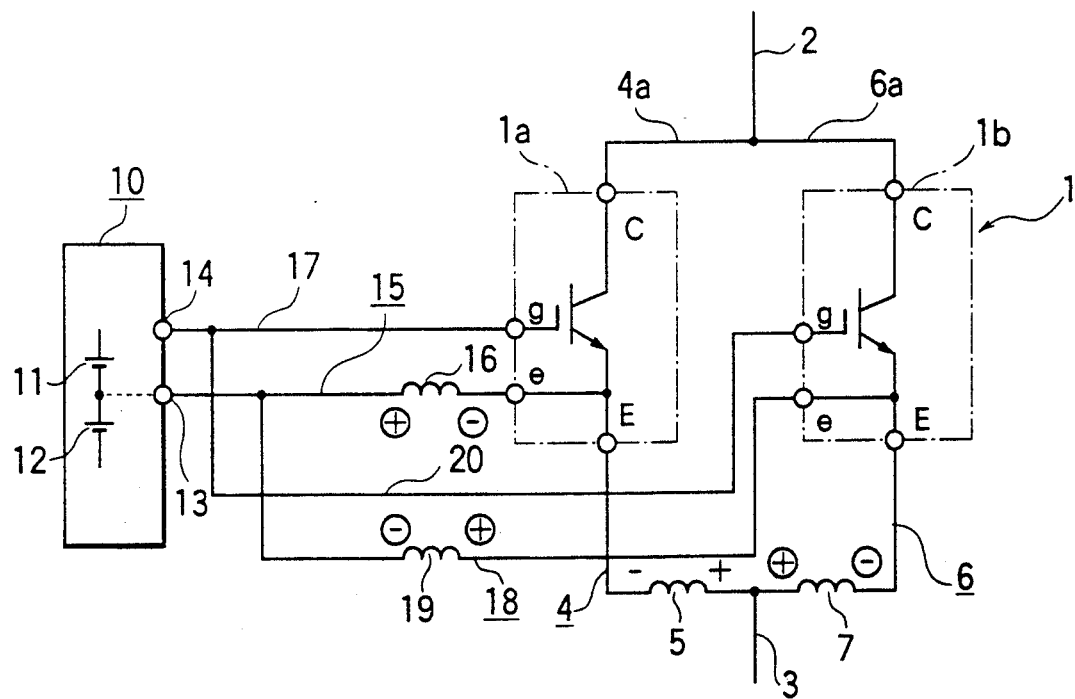
FIG. 7 is a circuit diagram showing this type of a conventional switching apparatus.

FIG. 1 is a circuit diagram showing an embodiment of a switching apparatus of according to the present invention. Transformers 31 and 35 are disposed between a control signal source 10 and, respectively, IGBTs 1a and 1b. The transformer 31 comprises a first coil 32 and a second coil 33, both of which are wound around an iron core 34 with the same number of turns in the same polarity, as shown in FIG. 1. The first coil 32 is inserted into a first connection line 15 connecting a terminal 13 of the control signal source 10 with a terminal (e) of the IGBT 1a. The second coil 33 is inserted into a second connection line 17 connecting a terminal 14 of the control signal source 10 with the control electrode (g) of the IGBT 1a. The construction of the transformer 35 is the same as that of the transformer 31. A first coil 36 and a second coil 37 are wound around an iron core 38 with the same number of turns in the same polarity. These coils are connected in the polarity shown in FIG. 1 between the control signal source 10 and the right IGBT 1b. Since the other components in FIG. 1 are the same as those of the prior art shown in FIG. 7, the same reference numerals are given to corresponding components, and an explanation thereof is omitted.

Next, an explanation will be provided of the operation of the switching apparatus. It will be assumed now that the state of both IGBTs 1a and 1b is changed from a conducting state to a non-conducting state by a signal from the control signal source 10 in the same manner as in the prior art in FIG. 7, whereby the main circuit electrodes of the IGBTs 1a and 1b shut off a current flowing from the collector C to the emitter E. For example, if the turn-off time of the IGBT 1a is shorter than the turn-off time of the IGBT 1b, the current flowing through the IGBT 1a decreases earlier. Regarding a voltage induced in the inductance 5, as shown in FIG. 1, the emitter E of the IGBT 1a has a negative polarity and the bus line 3 has a positive polarity in the same manner as in the prior art. This developed voltage is divided across the impedance of an inductance 7, an inductance 19, the first coil 36 of the transformer 35, the first coil 32 of the transformer 31, and the inductance 16, in a series circuit including a first connection conductor 6 on the right side thereof, first connection lines 18 and 15, and transformers 35 and 31. The excited impedance values of the transformers 31 and 35 are selected to be substantially larger than the impedances of the inductances 16 and 19, with the result that the first coil 32 of the transformer 31 and the first coil 36 of the transformer 35 are burdened with most of the voltage induced in the inductance 5. The same voltage which has the same polarity as the voltage applied to these first coils 32 and 36 is induced in the second coils 33 and 37, respectively. As a result, the respective voltage amounts applied between the emitters E and the control electrodes g of the IGBTs 1a and 1b cancel each other through the first coil 32 and the second coil 33 of the transformer 31, and the first coil 36 and the second coil 37 of the transformer 35, respectively. Since the respective impedances of the transformers 31 and 35 as seen from the control signal source 10 become zero, there is no hindrance to a signal applied between the control electrode (g) and the terminal (e) of each of the IGBTs 1a and 1b. A desired signal can be applied between the control electrode (g) and the terminal (e).

Figure 2:
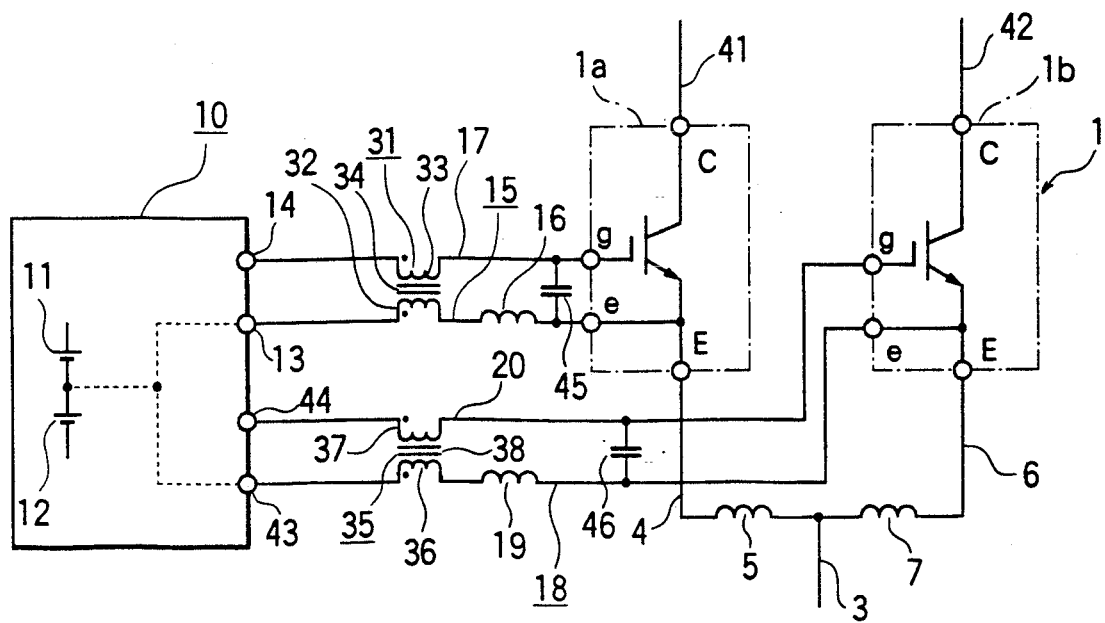
FIG. 2 is a circuit diagram showing another embodiment of the switching apparatus according to the present invention.

FIG. 2 shows another embodiment of the present invention. The collectors C of the IGBTs 1a and 1b are respectively connected to bus lines 41 and 42 which are connected to individual power supply connections. IGBTs 1a and 1b are controlled at different times by the control signal source 10. In this case control signal source 10 includes, terminals 43 and 44 in addition to terminals 13 and 14 and the first signal source 11 and the second signal source 12 are connected as shown, so that the IGBTs 1a and 1b can be individually controlled by the control signal source 10. The voltage of the first signal source 11 or that of the second signal source 12 is individually applied between the control electrodes (g) and the terminals (e) of the IGBTs 1a and 1b by closing a switching circuit (not shown). Capacitors 45 and 46 are capacitors for absorbing surges, and are disposed respectively between the control electrode (g) and the terminal (e) of each of the IGBTs 1a and 1b; that is, each capacitor is connected between a pair the first and second connection lines.

In the switching apparatus shown in FIG. 2 and constructed as described above, the IGBTs 1a and 1b are controlled independently of each other. A voltage developed across the inductance 5 or the inductance 7 when each of the IGBTs 1a and 1b are opened or closed is compensated by transformers 31 and 35. Hence, the voltage does not develop between the control electrode (g) and the terminal (e) in the same manner as in the embodiment of FIG. 1.

In each of the embodiments described above, transformers 31 and 35 are singly inserted between the control signal source 10 and the control electrode (g) of each of the IGBTs 1a and 1b respectively. However, the same effect can be achieved if other impedance elements are inserted in series in addition to the transformers 31 and 35. The ratio of the number of turns of the first and second coils of the transformers 31 and 35 need not necessarily be 1 to 1.

Figure 3:
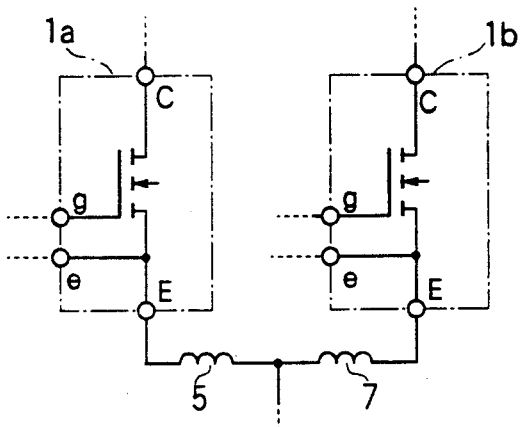
FIGS. 3 through 6 are views showing other semiconductor control elements for use in the present invention.
Figure 4:
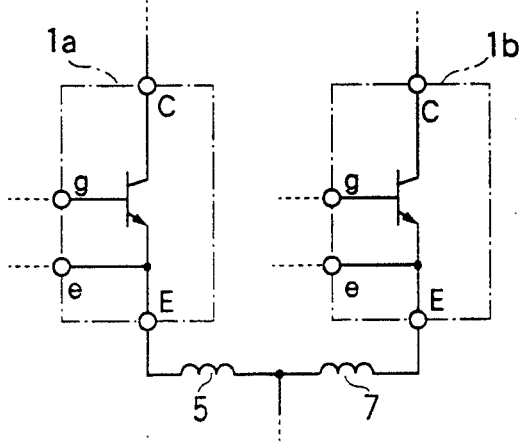
Figure 5:
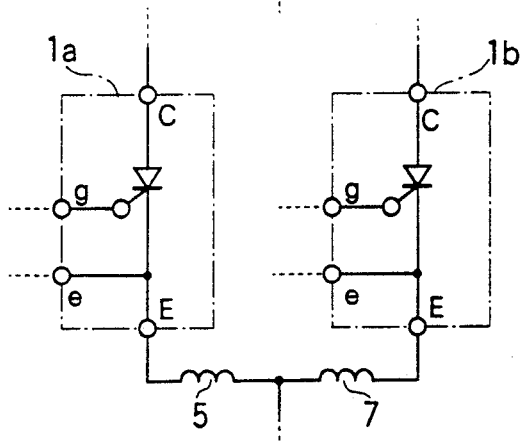
Figure 6:
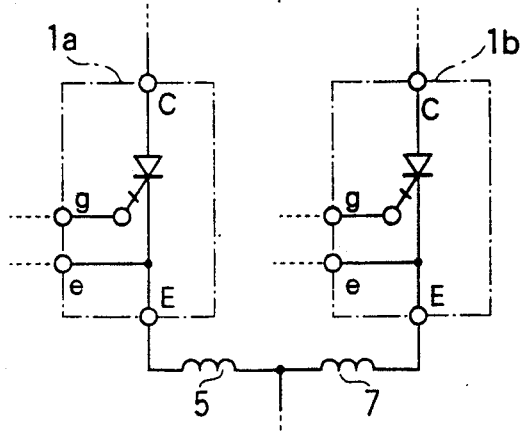

Although IGBTs are the semiconductor control elements are in each of the embodiments described above, needless to say, the same effect can be obtained (a) if voltage driven semiconductor switching elements such as MOSFETs, as shown in FIG. 3, are used, (b) if current driven type semiconductor switching elements, such as bipolar transistors shown in FIG. 4, are used, and (c) if semiconductor switching elements, such as thyristors or gate turn-off thyristors (GTO), as shown in FIGS. 5 and 6, are used.

As has been explained above, according to the present invention, a transformer is connected between each semiconductor switching element and a control signal source to cancel a voltage developed at the time the semiconductor switching elements are switched, thereby causing no abnormal voltage to be applied to the control electrodes of the semiconductor switching elements. Therefore, a highly reliable switching apparatus in which semiconductor switching elements do not malfunction and no insulation breakdown occurs can be obtained.

What is claimed is:

1. A switching apparatus comprising:
   at least two semiconductor switching elements, each switching element including first and second main electrodes and a control electrode, each switching element being switched between electrically open and electrically closed states in response to a control signal applied to its respective control electrode, said first main electrodes of said at least two switching elements being connected to a first bus line and said second main electrodes of said at least two switching elements being connected to a second bus line for electrically connecting and disconnecting the first and second bus lines in response to said control signal; and
   a respective connection circuit for each switching element connecting said control signal to the corresponding switching element, each connection circuit including a transformer having a primary winding and a secondary winding, said primary winding being connected in series between a control signal terminal of control signal source, which supplies said control signal, and said control electrode of the corresponding switching element, said secondary winding being connected between a reference signal terminal of the control signal source, which supplies a reference signal, and said second main electrode of the corresponding switching element, whereby transient voltages produced during switching of said switching elements due to different switching characteristics of said at least two switching elements are substantially cancelled by said transformers.

2. The switching apparatus as claimed in claim 1 including respective surge voltage absorbing means connected between the second main electrode and the control electrode of each of said corresponding semiconductor switching elements.

3. The switching apparatus as claimed in claim 2 wherein each of said surge voltage absorbing means comprises a plurality of capacitor.

4. The switching apparatus as claimed in claim 1 wherein the semiconductor switching elements are insulated gate bipolar transistors.

5. The switching apparatus as claimed in claim 1 wherein the semiconductor switching elements are insulated gate type field effect transistors.

6. The switching apparatus as claimed in claim 1 wherein the semiconductor switching elements are current driven semiconductor switching elements.

7. The switching apparatus as claimed in claim 1 wherein the semiconductor switching elements are thyristors.

8. The switching apparatus as claimed in claim 1 wherein the semiconductor switching elements are GTO thyristors.

9. The switching apparatus as claimed in claim 1 wherein each of said transformers has an iron core around which the primary and secondary windings are wound.

10. The switching apparatus as claimed in claim 1 wherein said primary and secondary windings of each of said transformers has a number of turns and the number of turns of the primary winding of each transformer is substantially equal to the number of turns of the secondary winding of that transformer.

* * * * *